United States Patent
Takahashi et al.

(10) Patent No.: US 9,462,698 B2
(45) Date of Patent: Oct. 4, 2016

(54) METALLIZED SUBSTRATE, METAL PASTE COMPOSITION, AND METHOD FOR MANUFACTURING METALLIZED SUBSTRATE

(75) Inventors: Naoto Takahashi, Yamaguchi (JP);
Yasuyuki Yamamoto, Yamaguchi (JP);
Emi Ushioda, Yamaguchi (JP)

(73) Assignee: TOKUYAMA CORPORATION, Shunan-shi, Yamaguchi (JP)

( * ) Notice: Subject to any disclaimer, the term of this patent is extended or adjusted under 35 U.S.C. 154(b) by 575 days.

(21) Appl. No.: 13/993,463

(22) PCT Filed: Dec. 2, 2011

(86) PCT No.: PCT/JP2011/077969
§ 371 (c)(1),
(2), (4) Date: Jun. 12, 2013

(87) PCT Pub. No.: WO2012/090647
PCT Pub. Date: Jul. 5, 2012

(65) Prior Publication Data
US 2013/0256014 A1    Oct. 3, 2013

(30) Foreign Application Priority Data

Dec. 28, 2010   (JP) .................................. 2010291626

(51) Int. Cl.
*H05K 1/09*     (2006.01)
*H05K 3/06*     (2006.01)
(Continued)

(52) U.S. Cl.
CPC ................ *H05K 3/06* (2013.01); *H05K 1/092* (2013.01); *H05K 3/108* (2013.01); *H05K 3/388* (2013.01); *H05K 1/0306* (2013.01); *H05K 2201/0317* (2013.01); *H05K 2201/0338* (2013.01);
(Continued)

(58) Field of Classification Search
CPC ........ H05K 3/06; H05K 3/108; H05K 3/338; H05K 1/092; H05K 1/0306; H05K 2201/0317; H05K 2201/0338; H05K 2201/0341; Y10T 428/265; Y10T 428/24967
USPC .......................................................... 174/257
See application file for complete search history.

(56) References Cited

U.S. PATENT DOCUMENTS

| | | | |
|---|---|---|---|
| 2,570,248 A * | 10/1951 | Kelley | C04B 37/006 123/169 CB |
| 4,729,504 A * | 3/1988 | Edamura | B23K 1/0008 228/122.1 |
| 2004/0035693 A1 | 2/2004 | Ru | |
| 2010/0290191 A1 | 11/2010 | Lin et al. | |
| 2012/0015152 A1 | 1/2012 | Takahashi et al. | |

FOREIGN PATENT DOCUMENTS

| | | |
|---|---|---|
| JP | 05-221759 A | 8/1993 |
| JP | 05-226515 A | 9/1993 |

(Continued)

*Primary Examiner* — Tremesha S Willis
(74) *Attorney, Agent, or Firm* — Ladas & Parry LLP

(57) ABSTRACT

The present invention provides: a method for manufacturing a metallized substrate by which a fine pattern can be formed more easily; a metallized substrate manufactured by the method; and a metal paste composition to be used in the method. The metallized substrate has: a sintered nitride ceramic substrate (10); a titanium nitride layer (20) on the sintered substrate (10); an adhesion layer (30) on the titanium nitride layer (20); and a copper plating layer (40) on or above the adhesion layer (30), wherein the adhesion layer (30) contains copper and titanium, and has a thickness of no less than 0.1 µm and no more than 5 µm.

11 Claims, 4 Drawing Sheets

(51) Int. Cl.
*H05K 3/10* (2006.01)
*H05K 3/38* (2006.01)
*H05K 1/03* (2006.01)

(52) U.S. Cl.
CPC .................. *H05K2201/0341* (2013.01); *Y10T 428/24967* (2015.01); *Y10T 428/265* (2015.01)

(56) References Cited

FOREIGN PATENT DOCUMENTS

| | | |
|---|---|---|
| JP | 07-207452 A | 8/1995 |
| JP | 07-240572 A | 9/1995 |
| WO | 2010/113892 A1 | 10/2010 |

\* cited by examiner

METALLIZED SUBSTRATE, METAL PASTE COMPOSITION, AND METHOD FOR MANUFACTURING METALLIZED SUBSTRATE

TECHNICAL FIELD

The present invention relates to a metallized substrate, a metal paste composition, and a method for manufacturing a metallized substrate. In specific, it relates to a metallized substrate having a fine pattern in which metallized patterns are narrowly spaced; a metal paste composition to be used for manufacturing the substrate; and a method for manufacturing the metallized substrate.

BACKGROUND ART

As a method for manufacturing a metallized ceramic substrate, a co-firing method (simultaneous firing method) and a post-firing method (sequential firing method) are known. In the co-firing method, a metal paste layer is formed on an raw ceramic substrate precursor called a green sheet to prepare a metallized ceramic substrate precursor and fire it. In this method, the green sheet and the metal paste are fired simultaneously.

In the post-firing method, a metal paste layer is formed on a ceramic substrate obtained by firing a green sheet to prepare a metallized ceramic substrate precursor and fire it. In this method, the green sheet and the metal paste layer are fired sequentially. Both of the methods allow formation of a metallized pattern on the ceramic substrate, and the substrate thus obtained is mainly used as a substrate for mounting an electronic component.

For example in the case of forming a wiring by the co-firing method, the green sheet is likely to shrink unevenly upon firing. If a square green sheet is sintered for example, a central portion on each side thereof shrinks slightly to warp inward, resulting in deformation of the substrate into a star shape. Therefore, when many metallized patterns having the same shape are formed on one green sheet, the shape of the pattern inevitably changes slightly depending on the location of the patterns.

On the other hand, in the case of forming a metallized pattern by the post-firing method, an electroconductive paste is applied directly on a ceramic substrate and dried, and thereafter fired to form the metallized pattern. When printing (firing) the electroconductive paste layer, the electroconductive paste layer shrinks in its thickness direction, but hardly shrinks in its planar direction. Thus, there is not a problem that the shape of the pattern changes depending on the location thereof, as seen in the co-firing method.

In this viewpoint, the post-firing method can be said to be suitable for forming a fine pattern on the substrate. However, as the size of the electronic components to mount on the substrate decreases, further improvement of precision and fineness of the metallized pattern on the substrate is required; and conventional manufacturing methods by the post-firing method cannot meet such requirements. For example, even when a metal paste is applied in an intended shape of a circuit pattern in the post-firing method, the metal paste sometimes flows or spreads before sintered, causing difficulty in achieving a fine pattern.

In the post-firing method, the metal paste is usually screen-printed on the sintered substrate and fired, to thereby form a metal pattern; and a titanium powder and the like for example is included in the metal paste in order to improve adhesion between the metal pattern and the substrate (see Patent Document 1). Since the method described in Patent Document 1 originally intends to form a metal pattern with only a metal paste layer, the metal pattern layer is thick and the cross section of the metal pattern formed is in a trapezoidal shape with a long base as shown in FIG. 1, causing further difficulty in forming a fine pattern. In the method, firing is performed after a metal paste layer not containing a titanium powder is formed on a metal paste layer containing a titanium powder. Upon firing, titanium will be dispersed in the area not having the titanium powder as well and will end up existing in the whole metallized pattern, though in varying concentration, thereby tends to cause degradation of the electrical conductivity. In this point, the method still needs improvement.

There is a method of forming a metallized pattern by an etching process (Patent Document 2), as a technique that allows further improvement of the pattern density than the method of forming the metallized pattern by the screen printing described above. In this method, a metallized substrate is produced by: forming sputtered titanium and copper layers on a sintered substrate; forming a copper plating in a through-hole; forming, by a photolithographic method, a resist pattern on a part where a metallized pattern is not to be formed; plating copper, nickel, and gold in the mentioned order; removing the resist; and removing the sputtered titanium and copper layers by etching.

CITATION LIST

Patent Documents

Patent document 1: Japanese Patent Application Laid-Open No. 7-240572
Patent document 2: US Patent Application Publication No. 2004/0035693

SUMMARY OF THE INVENTION

Problems to be Solved by the Invention

According to the method described in Patent Document 2, in which a metallized pattern is formed by a photolithographic method and by etching, a fine pattern having a line-and-space of about 20/20 µm can be formed. However, this method needs to form a sputtered layer so as to form the metallized pattern, and thus requires a special facility to form the sputtered layer, and the like. Therefore, it is not convenient to manufacture a metallized substrate by this method.

It is therefore an object of the present invention to provide: a method for manufacturing a metallized substrate by which a fine pattern can be formed more easily; a metallized substrate manufactured by the method; and a metal paste composition to be used in the method.

Means for Solving the Problems

It is difficult to form a fine pattern by the method of forming a metallized pattern by applying a metal paste composition in a pattern shape by screen printing and thereafter firing it, as described above. Further, the method of forming a metallized pattern by forming a sputtered layer and etching it is not a simple method. Therefore, a new approach needs to be taken.

As the new approach, the inventors have completed a method for manufacturing a metallized substrate, a metallized substrate obtained by the method, and a metal paste composition to be used in the method, which are described below.

A first aspect of the present invention is a metallized substrate (100) having: a sintered nitride ceramic substrate (10); a titanium nitride layer (20) on the sintered substrate (10); an adhesion layer (30) on the titanium nitride layer (20); and a copper plating layer (40) on or above the adhesion layer (30), wherein the adhesion layer (30) contains copper and titanium, and has a thickness of no less than 0.1 μm and no more than 5 μm.

In the metallized substrate (100) having the above layer structure, the copper plating layer (40) is formed on the titanium nitride layer (20) and the adhesion layer (30), therefore allowing favorable adhesion of the copper plating layer (40) to the substrate (10). Further, with the adhesion layer (30) for ensuring adhesion made thin, electrical conduction is ensured by the copper plating layer having favorable electrical conductivity.

In the first aspect of the present invention, a thickness ratio between the adhesion layer (30) and the copper plating layer (40) (adhesion layer (30)/copper plating layer (40)) is preferably 1/50 to 1/1. With such a thickness ratio, the adhesiveness of the metal layer and the electrical conductivity of the metal layer can be balanced.

In the first aspect of the present invention, the adhesion layer (30) preferably does not contain silver. If the adhesion layer (30) contains silver, a problem may occur when patterning the metal layer by etching it, as will be explained in detail below.

In the first aspect of the present invention, the titanium nitride layer (20), the adhesion layer (30), and the copper plating layer (40) on or above the sintered nitride ceramic substrate (10) preferably constitute a metallized pattern formed by a photolithographic method. Forming the pattern by a photolithographic method enables the line-and-space of the metallized pattern to be no more than 50/50 μm.

A second aspect of the present invention is a metal paste composition having: a metal component containing a copper powder and a titanium hydride powder, and not containing a silver powder; and a high-viscosity solvent having a viscosity at 25° C. of no less than 100 Pa·s, wherein the metal paste composition contains 5 to 50 mass parts of the titanium hydride powder and 10 to 50 mass parts of the high-viscosity solvent per 100 mass parts of the copper powder.

As will be described in detail below, if the metal layer formed on the substrate (10) contains silver powder, a problem will occur at a time of performing etching. Therefore, the metal paste composition to form the metal layer preferably does not contain a silver powder. In order to attain favorable sintering, the titanium hydride powder to form a liquid phase needs to be contained in the predetermined range of amount. Since the high-viscosity solvent is used, it can be easily removed while the viscosity of the paste is maintained, and therefore makes it easy to form a fine pattern.

In the second aspect of the present invention, the metal paste composition preferably contains no binder component or less than 4 mass parts of a binder component per 100 mass parts of the copper powder.

If the metal paste composition contains the binder component in the amount over the above range, the metal layer cannot be made dense in the firing step. It is also preferable to ensure the viscosity of the metal paste composition by reducing the amount of an organic binder as much as possible and using the high-viscosity solvent.

Since the solid content concentration in the metal paste composition of the present invention is low, it is possible to improve leveling of the metal paste composition (reduce a mesh mark left upon screen printing), and to reduce the thickness of the printed layer.

In the second aspect of the present invention, the titanium hydride powder preferably has a particle size distribution not containing a coarse particle having a particle size greater than 5 μm. If the coarse particle is contained, protrusions will sometimes be formed on the metal layer. In the present invention, in which the adhesion layer (30) is made thin, caution is needed.

In the second aspect of the present invention, the average particle size of the copper powder is preferably no less than 0.1 μm and less than 1.0 μm. Use of the copper powder having the average particle size in the above range makes it possible to obtain a dense metal layer.

A third aspect of the present invention is a method for manufacturing a metallized substrate (100a) including the steps of:

(i) applying the metal paste composition (32) of the second aspect of the present invention on a whole surface of a side of a nitride ceramic sinter (10) where a metallized pattern is to be formed;

(ii) firing a substrate obtained through the step (i), thereby forming a titanium nitride layer (20) and an adhesion layer (30) in the order mentioned on or above the nitride ceramic sinter (10);

(iii) forming a copper plating layer (40) on the adhesion layer (30);

(iv) forming a resist pattern (50) on a part of the copper plating layer (40) to be left as a wiring pattern, by a photolithographic method;

(v) removing a part of the copper plating layer (40) and the adhesion layer (30) where the resist pattern (50) is not formed, by an etching process;

(vi) removing the resist pattern (50); and (vii) etching an exposed part of the titanium nitride layer (20).

A fourth aspect of the present invention is a method for manufacturing a metallized substrate (100b) including the steps of:

(i) applying the metal paste composition (32) of the second aspect of the present invention on a whole surface of a side of a nitride ceramic sinter (10) where a metallized pattern is to be formed;

(ii) firing a substrate obtained through the step (i), thereby forming a titanium nitride layer (20) and an adhesion layer (30) in the order mentioned on or above the nitride ceramic sinter (10);

(iii) forming a resist pattern (50) on a part of the adhesion layer (30) where a wiring pattern is not to be formed, by a photolithographic method;

(iv) forming a copper plating layer (40) on a part of the adhesion layer (30) where the resist pattern (50) is not formed;

(v) removing the resist pattern (50);

(vi) etching an exposed part of the adhesion layer (30); and (vii) etching an exposed part of the titanium nitride layer (20).

In the fourth aspect of the present invention, the method preferably further includes the step of: (ii') forming an anti-oxidation layer (52) on the adhesion layer (30) by copper strike, after the firing step (ii).

In the third and the fourth aspects of the present invention, the method preferably further includes the step of: (ii")

polishing the surface of the adhesion layer (30), after the firing step (ii). In the forth aspect of the present invention, when the anti-oxidation layer (52) is formed on the adhesion layer (30), it is preferable to polish the surface of the adhesion layer (30) before forming the anti-oxidation layer (52).

Effects of the Invention

In the methods for manufacturing a metallized substrate of the third and the fourth aspects of the present invention, a metallized pattern is formed by applying the metal paste composition on the whole surface of the sintered nitride ceramic substrate (10), firing the substrate with the metal paste composition applied thereon, and then patterning the metal layer formed, by a photolithographic method. Therefore, a highly fine wiring pattern can be formed.

Since a part of the metal layer formed on the whole surface of the sintered substrate (10) needs to be etched, the metal paste composition of the second aspect of the present invention to form the metal layer needs to be a metal paste composition that allows the etching to be performed favorably. The metal paste composition also needs to be a metal paste composition that can form a dense metal layer by being fired. The metal composition of the second aspect of the present invention meets such requirements.

The metallized substrate (100) of the first aspect of the present invention is manufactured by the methods of the third and the fourth aspects of the present invention described above. Since the titanium nitride layer (20) and the adhesion layer (30) ensure the adhesion between the copper plating layer (40) and the sintered substrate (10), and the copper plating layer (40) ensures the electrical conduction, a metallized pattern with good adhesiveness and good electrical conductivity is formed.

MODES FOR CARRYING OUT THE INVENTION

The present invention relates to: a method for manufacturing a metallized substrate by which a fine pattern can be formed more easily; a metallized substrate manufactured by the method; and a metal paste composition to be used in the method. First, the method for manufacturing a metallized substrate of the present invention will be described. The metallized substrate of the present invention is manufactured by two representative examples of the method (the third and the fourth aspects of the present invention) described below. A metallized pattern formed has a titanium nitride layer 20, an adhesion layer 30, and a copper plating layer 40. With the titanium nitride layer 20 and the adhesion layer 30, the adhesion between the sintered nitride ceramic substrate 10 and the copper plating layer 40 is ensured. In addition, the thickness of the adhesion layer 30 is made small to a predetermined degree and the thickness of the copper plating layer 40 is secured, therefore allowing the metallized pattern to have favorable electrical conductivity.

The both methods make the metal layer formed on the whole surface of the sintered nitride ceramic substrate 10 be patterned by a photolithographic method, and therefore makes it possible to easily form a highly fine metallized pattern.

<Method for Manufacturing a Metallized Substrate of the Third Aspect of the Present Invention>

Figure 1:
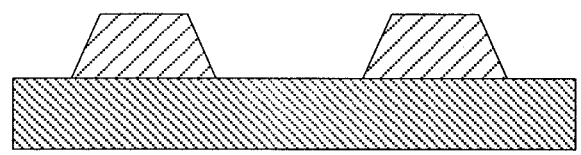
FIG. 1 is a cross-sectional view of a conventional metallized substrate formed by applying a metal paste by screen printing.
Figure 2:
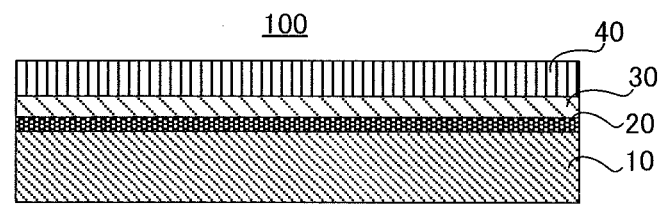
FIG. 2 is a cross-sectional view of the metallized substrate of the present invention.
Figure 3:
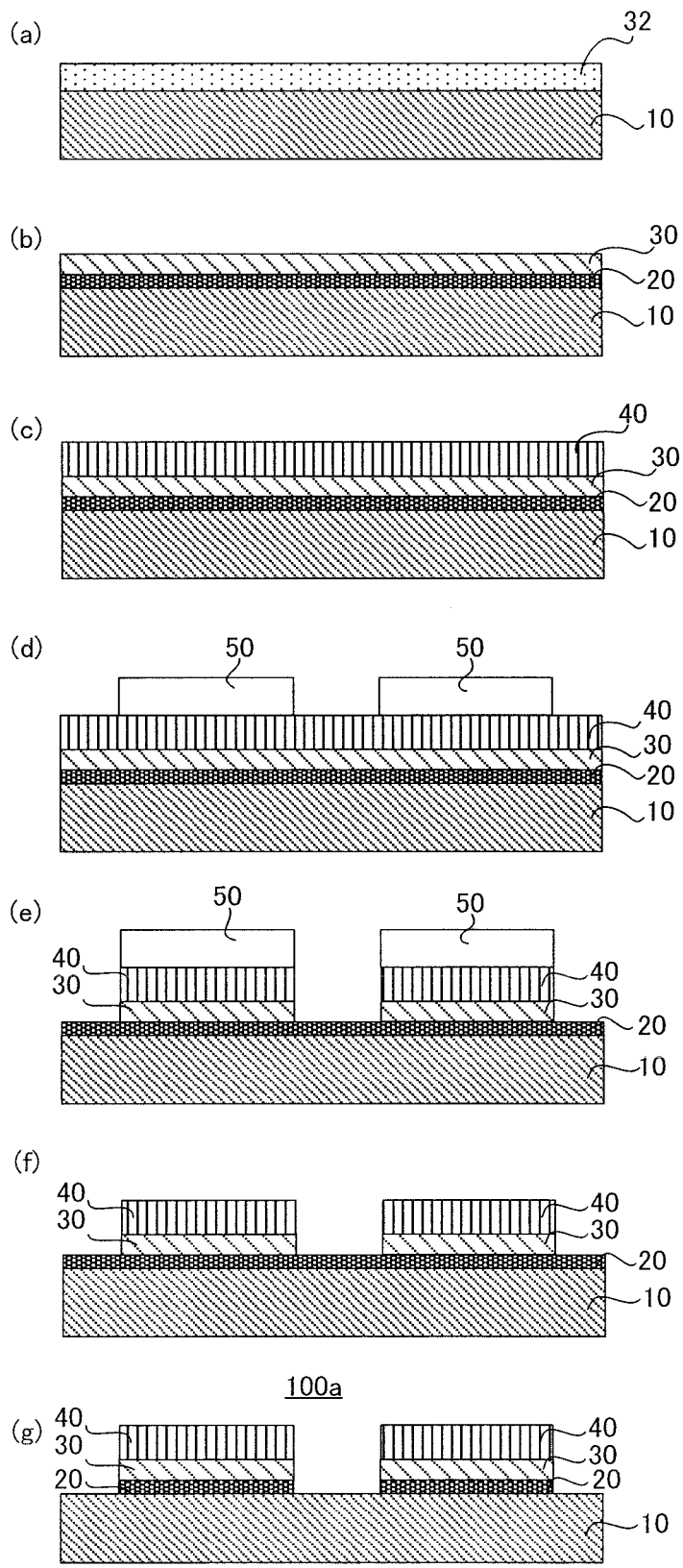
FIG. 3 is a schematic diagram showing each step of the method for manufacturing a metallized substrate of the third aspect of the present invention.

Hereinafter, the method for manufacturing a metallized substrate of the third aspect of the present invention will be described with reference to FIG. 3.

The method for manufacturing a metallized substrate 100a of the third aspect of the present invention includes the steps of:

(3-i) applying the metal paste composition 32 of the second aspect of the present invention on a whole surface of a side of a nitride ceramic sinter 10 where a metallized pattern is to be formed;

(3-ii) firing a substrate obtained through the step (3-i), thereby forming a titanium nitride layer 20 and an adhesion layer 30 in the order mentioned on or above the nitride ceramic sinter 10;

(3-iii) forming a copper plating layer 40 on the adhesion layer 30;

(3-iv) forming a resist pattern 50 on a part of the copper plating layer 40 to be left as a wiring pattern, by a photolithographic method;

(3-v) removing a part of the copper plating layer 40 and the adhesion layer 30 where the resist pattern 50 is not formed, by an etching process;

(3-vi) removing the resist pattern 50; and (3-vii) etching an exposed part of the titanium nitride layer 20.

Each of the steps will be described below.

(Step (3-i))

First, the metal paste composition 32 of the second aspect of the present invention is applied on a whole surface of a side of a nitride ceramic sinter 10 where a metallized pattern is to be formed.

<Sintered Nitride Ceramic Substrate>

The sintered nitride ceramic substrate 10 can be made by a known method in which a nitride ceramic green sheet having a predetermined shape or a pressure-formed body obtained by shaping nitride ceramic granules under pressure is fired. The shape, the thickness, etc. are not particularly limited. An ordinarily-used sintering aid such as rare earths may be contained in a raw material of the sinter. A surface of the sintered nitride ceramic substrate 10 may be polished as necessary to be smoothed. Examples of the nitride ceramics include: aluminum nitride, silicon nitride, boron nitride, zirconium nitride, titanium nitride, tantalum nitride, and niobium nitride. Among them, it is preferable to use aluminum nitride, which has such properties as high thermal conductivity.

<Metal Paste Composition of the Second Aspect of the Present Invention>

The metal paste composition of the second aspect of the present invention contains: a metal component containing a copper powder and a titanium hydride powder, and not containing a silver powder; and a high-viscosity solvent having a viscosity at 25° C. of no less than 100 Pa·s, wherein the metal paste composition contains 5 to 50 mass parts of the titanium hydride powder and 10 to 50 mass parts of the high-viscosity solvent per 100 mass parts of the copper powder.

The inventors thought that it might be possible to form a fine pattern by: applying a metal paste composition containing a low-melting-point metal such as silver on a whole surface of the sintered nitride ceramic substrate 10; firing the substrate with the metal paste composition thereon, thereby forming a metal layer on the whole surface of the sintered nitride ceramic substrate 10; and etching the metal layer into a predetermined pattern. However, when they actually etched the metal layer, they found that an etching liquid and silver in the metal layer reacted with each other, causing formation of a passive state film, and that a large amount thereof remained as a residue. Adding a step of removing the residue makes the manufacturing method complicated.

When the metal paste composition contains a titanium component, the sintered nitride ceramic substrate 10 and the titanium component react with each other to form a titanium nitride layer in the interface between the metallized pattern and the sintered substrate 10. The titanium nitride layer makes the adhesion between the metallized pattern and the sintered substrate 10 favorable. However, when the metal layer contains silver, the silver in the metal layer sometimes acts as a catalyst and decomposes an etching liquid when etching the titanium nitride layer, depending on the nature of the etching liquid used, thus sometimes inhibiting etching of the titanium nitride layer.

From the above reasons, the inventors decided not to include silver in the metal paste composition of the present invention.

However, the story is not that simple. When a metal paste composition containing a copper powder and a silver powder is used, silver forms a liquid phase upon firing, facilitating sintering of the metal paste composition, and thereby allows formation of a dense metal layer. When the metal paste composition does not contain silver, the liquid phase is not formed and therefore a dense metal layer cannot be formed. If the liquid phase is not formed, sintering will proceed insufficiently and a number of voids will be generated in the metal layer, resulting in a metal layer with deteriorated strength and deteriorated electrical conductivity.

The inventors studied a component which forms a liquid phase other than silver, in order to form a dense metal layer, and decided to include a predetermined amount of titanium hydride in the metal paste as the titanium hydride also forms a liquid phase upon firing. In the metal paste composition of the second aspect of the present invention, the lower limit of the content of the titanium hydride powder per 100 mass parts of the copper powder in the metal paste is no less than 5 mass parts, preferably no less than 10 mass parts, more preferably no less than 20 mass parts. The upper limit thereof is no more than 50 mass parts, preferably no more than 40 mass parts, and more preferably no more than 30 mass parts.

The metal paste composition of the second aspect of the present invention described above makes it possible to prevent problems during etching and also makes it possible to form a dense metal layer.

The metal paste composition of the present invention contains a high-viscosity solvent having a viscosity at 25° C. of no less than 100 Pa·s. The content thereof is no less than 10 mass parts and no more than 50 mass parts, preferably no less than 20 mass parts and no more than 40 mass parts, per 100 mass parts of the copper powder. The content of the high-viscosity solvent in the above range allows reduction of the amount of a binder component and formation of a dense thin metal layer while securing the viscosity of the metal paste composition, as will be explained in detail below. Although the reason for this is unknown, it is considered that: since the high-viscosity solvent is removed by vaporization upon firing, it can be removed more easily than the binder component which is removed by pyrolysis, and therefore a thin but dense metal layer can be formed. Although the upper limit of the viscosity at 25° C. of the high-viscosity solvent is not particularly limited as long as the high-viscosity solvent can be removed by vaporization upon firing, it is usually 1000 Pa·s.

A specific example of the high-viscosity solvent is isobornylcyclohexanol. Isobornylcyclohexanol can be favorably employed since its viscosity is highly dependent on temperature.

The viscosity at 25° C. of the metal paste composition is preferably no less than 10 Pa·s and no more than 100 Pa·s, in view of the printability and the adhesiveness to the sintered substrate.

As long as the viscosity of the metal paste composition formed is in the above range, the metal paste composition may also contain an ordinary solvent in combination with the high-viscosity solvent. Examples of the ordinary solvent include toluene, ethyl acetate, terpineol, butyl carbitol acetate, and texanol. A known surfactant, plasticizer, and the like may also be added in order to improve the printability and the preservation stability. Examples of the dispersant that can be favorably employed include: phosphate-based dispersants and polycarboxylic acid-based dispersants.

In addition, the metal paste composition of the second aspect of the present invention contains no binder component or preferably less than 4 mass parts, more preferably 2 mass parts or less, and still more preferably 1 mass part or less of a binder component, per 100 mass parts of the copper powder. If the content of the binder component in the metal paste composition exceeds the above range, the metal layer may not become dense in the firing step. In this case as well, the viscosity at 25° C. of the metal paste composition is preferably no less than 10 Pa·s and no more than 100 Pa·s.

As described above, the metal paste composition of the present invention contains no binder component or contains a small amount of a binder component and thus has a low solid content concentration. Therefore, it is possible to improve leveling of the metal paste composition (reduce a mesh mark left upon screen printing), and to reduce the thickness of the printed layer.

In the metal paste composition of the second aspect of the present invention, the titanium hydride powder preferably has a particle size distribution that does not contain a coarse particle whose particle size is greater than 5 μm. If the coarse particle is contained, protrusions may be formed on the metal layer (a surface of the adhesion layer 30). In the present invention, in which the adhesion layer 30 is made thin, caution is needed. The average particle size of the titanium hydride powder is preferably no less than 0.5 μm and no more than 5 μm. If the average particle size of the titanium hydride powder is too small, oxidation of the titanium powder may occur, causing voids in the metal layer. In the present specification, the particle size distribution and the average particle size are a volume distribution measured by laser diffractometry using Microtrack manufactured by Nikkiso Co., Ltd., and a sphere equivalent diameter (volume average D50) which gives the median of the volume distribution, respectively.

In the second aspect of the present invention, the average particle size of the copper powder is preferably no less than 0.1 μm and less than 1.0 μm. Use of the copper powder having the average particle size in the above range makes it possible to obtain a dense metal layer.

The metal paste composition of the second aspect of the present invention is produced by quantifying each of the components described above, mixing them using a stirring-defoaming apparatus (e.g. a planetary stirring-defoaming apparatus (MAZERUSTAR, manufactured by Kurabo Industries Ltd.)), and thereafter kneading and breaking them up (breaking up the coarse particles of the titanium hydride powder) using a three-roll mill or the like.

The metal paste composition of the second aspect of the present invention described above is applied on a whole surface of a side of the sintered ceramic substrate 10 where a metallized pattern is to be formed. Usually, the metal paste composition is applied on a whole surface of one side of the sintered ceramic substrate 10, thereby forming a metallized pattern on that side. However, the metal paste composition may be applied on whole surfaces of both sides of the sintered ceramic substrate 10, thereby forming a metallized pattern on the both sides of the substrate 10.

(Step (3-ii))

In the step (3-ii), the sintered ceramic substrate 10 having the metal paste composition 32 thereon is fired, and thereby a titanium nitride layer 20 and an adhesion layer 30 are formed in the order mentioned on or above the nitride ceramic sinter 10.

(Firing Step)

The sintered ceramic substrate 10 having the metal paste composition 32 applied thereon is preferably fired under a non-oxidizing atmosphere in a heat-resistant container. Examples of the non-oxidizing atmosphere are a vacuum atmosphere, an atmosphere of an inert gas such as argon gas and helium gas, and an atmosphere of hydrogen gas. Moreover, it may be a mixed atmosphere of the inert gas and the hydrogen gas. Among these non-oxidizing atmospheres, the vacuum atmosphere or the mixed atmosphere of the inert gas and the hydrogen gas is preferably adopted. When the firing is performed under vacuum, the degree of vacuum is preferably as high as possible in order to prevent a reactive gas such as oxygen and nitrogen in the atmosphere from reacting with titanium, and is preferably $1.33 \times 10^{-1}$ Pa or less, and more preferably $1.33 \times 10^{-2}$ Pa or less. Although the upper limit of the degree of vacuum is not particularly limited, it is $1.33 \times 10^{-4}$ Pa or more in view of industrial production.

The heat-resistant container is not limited as long as it is made of a material sufficiently resistant to the temperature of firing the sintered ceramic substrate 10 having the metal paste composition 32 applied (an object to be fired). Preferably it does not transmit gas, does not generate gas from the container itself, and is highly airtight even under the high temperature condition during firing. Specific examples of the material that can be favorably used for the heat-resistant container include: nitride sinters of aluminum nitride, boron nitride, silicon nitride, and so on; oxide sinters of alumina, magnesia, zirconia, and so on; heat-resistant alloys such as Incoloy and Hastelloy; and quartz glass. Among them, the nitride sinters, which are excellent in thermal conductivity, are preferred in view of ensuring thermal uniformity in the container during firing.

The heat-resistant container is seen to function, in the firing step, to block an atmosphere around the object to be fired from the other atmosphere in the firing furnace and to inhibit contaminants such as decomposition products resulting from a binder in the paste decomposed, scattered, and re-deposited on a wall of the furnace and so on, from being re-scattered with increasing temperature inside the furnace and reacting with the titanium component in the metal paste layer. Therefore, it is preferable to use a heat-resistant container on which a lid can be put so that the atmosphere near the object to be fired can be blocked from the other atmosphere in the firing furnace in the firing step. The heat-resistant container may be configured to be completely closed, or may have a gap to the extent that allows gas generated by the pyrolysis of the binder in the metal paste to be released to the outside of the container.

The shape of the heat-resistant container preferably has a size which does not cause temperature distribution in the heat-resistant container in the firing furnace. For this reason as well, the heat-resistant container is preferably made of a nitride sinter, which is excellent in thermal conductivity.

In the present invention, firing the metal paste composition containing a titanium component causes reaction of the titanium component with the nitrogen component in the sintered substrate 10 and formation of the titanium nitride layer 20 between the adhesion layer 30 and the sintered substrate 10. Some of the titanium component is likely to move to the surface of the adhesion layer 30. Adopting the particular firing conditions described above makes it possible to inhibit the titanium component in the metal paste composition from migrating to the surface of the adhesion layer 30 and to form the titanium nitride layer 20 sufficiently. Thereby, it is possible to attain more favorable adhesion of the adhesion layer 30 to the sintered substrate 10, and also possible to reduce the titanium concentration on the surface of the adhesion layer 30, allowing favorable plating performance on the surface of the adhesion layer 30.

The firing is performed preferably at no less than 900° C. and no more than 1000° C., and more preferably at no less than 930° C. and no more than 970° C. A dense adhesion layer 30 is formed by performing the firing at such temperature. If the firing temperature is too low, a liquid phase cannot be formed sufficiently, likely preventing formation of a dense metal layer. If the firing temperature is too high, a surface of the metal layer may become rough. The firing time may be adequately determined depending on the wiring pattern, the layer thickness, and the like. Firing may be performed favorably for several tens of seconds or more and an hour or less within the above temperature range.

(Titanium Nitride Layer 20)

The titanium nitride layer 20 is formed in the interface between the sintered nitride ceramic substrate 10 and the adhesion layer 30 by the reaction of the titanium component in the metal paste composition with the nitrogen component in the sintered nitride ceramic substrate 10. It is confirmed that reaction of titanium and a nitride aluminum sinter proceeds at a very high speed and that thereby the wettability becomes favorable. It is considered that formation of the titanium nitride layer 20 makes it possible to attain strong adhesiveness of the adhesion layer 30.

The titanium nitride layer 20 may contain copper, ceramic components and so on, in addition to titanium nitride. It contains 50 mass % or more, preferably 70 mass % or more of titanium nitride, based on the mass (100 mass %) of the whole titanium nitride layer 20. Although the thickness of the titanium nitride layer 20 is not particularly limited, the lower limit thereof is no less than 0.05 μm, preferably no less than 0.10 μm, and more preferably no less than 0.20 μm, in order to attain favorable adhesiveness of the adhesion layer 30. Although the upper limit thereof is not particularly limited, it is usually no more than 3.0 μm, preferably no more than 2.0 μm, in view of the actual production. The thickness of this titanium nitride layer 20 can be measured by observing the cross section of the metallized substrate 100a using an electron microscope.

<Adhesion Layer 30>

The adhesion layer 30 is formed on the titanium nitride layer 20 described above by applying the metal paste composition 32 on the sintered nitride ceramic substrate 10 and firing the substrate with the metal paste composition 32 applied thereon. The adhesion layer 30 contains 15 mass parts or less, preferably 10 mass parts or less of titanium per 100 mass parts of copper.

The adhesion layer 30 of the present invention contains a relatively large amount of titanium component derived from the metal paste composition. The adhesion layer 30 also contains a relatively large amount of metal generated by the reduction of the nitride ceramic in forming the titanium nitride layer (aluminum if the nitride ceramic is an aluminum nitride ceramic). As such, the adhesion layer 30 cannot be expected to have high electrical conductivity. Therefore, the thickness of the adhesion layer 30 is made small to the extent that ensures the adhesiveness, as will be explained below. The surface of the adhesion layer 30 may become rough with a large amount of titanium contained in the adhesion layer 30. Thus, the surface of the adhesion layer 30 may be polished after the firing step, as will be explained below.

The mass ratio of the components of the adhesion layer 30 is based on a value calculated by analyzing a layered body of (adhesion layer 30)/(titanium nitride layer 20)/(sintered nitride ceramic substrate 10). The mass ratio can be analyzed by dissolving only the adhesion layer 30 (excluding the titanium nitride layer part) by an etching treatment using an acid or the like and analyzing a solution thus obtained. The lower limit of the thickness of the adhesion layer 30 is preferably no less than 0.1 µm, more preferably no less than 0.2 µm, still more preferably no less than 0.4 µm, in order to attain favorable adhesiveness of the copper plating layer 40 formed on the adhesion layer 30. On the other hand, if the thickness of the adhesion layer 30 is greater than 5 µm, a fine pattern cannot be formed, which is thus unfavorable. For example, as it is necessary to remove the adhesion layer 30 by etching when forming a fine pattern, if the thickness of the adhesion layer 30 is greater than 5 µm, it will take a long time to perform the etching and therefore it is highly likely to negatively influence a metallized pattern needed. Therefore, the upper limit of the thickness of the adhesion layer 30 is preferably no more than 5 µm, more preferably no more than 4 µm, and still more preferably no more than 3 µm.

In the present invention, it is found that sintering of the metal layer can be promoted sufficiently by increasing the amount of the titanium hydride in the metal paste composition of the second aspect of the present invention; however, in this case, there is a new problem that the electrical conductivity of the adhesion layer 30 will degrade with a large amount of titanium component contained in the adhesion layer 30 formed. Therefore, the inventors decided to minimize the thickness of the adhesion layer 30 containing titanium and to form the copper plating layer 40 thereon in order to ensure the electrical conductivity.

The surface of the adhesion layer 30 formed may have protrusions due to the firing step described above. In the present invention, since the adhesion layer 30 is made thin, the surface thereof may become rough depending on the particle size of the titanium hydride. Therefore, a step of polishing the surface of the adhesion layer 30 to smooth it may be included before the subsequent step (3-iii). The method of polishing the surface is not particularly limited. Such methods as mechanical polishing using an abrasive and chemical polishing using an acid and an alkali may be adopted.

(Step (3-iii))

In the step (3-iii), the copper plating layer 40 is formed on the surface of the adhesion layer 30. The method of forming the copper plating is not particularly limited. Both electroplating and electroless plating may be adopted. They may be performed in combination. In view of efficiently forming a thick plating, it is efficient to perform electroless plating first and then perform electroplating using the electroless plating given as the seed for the electroplating. The lower limit of the thickness of the copper plating layer 40 is preferably no less than 2 µm, and more preferably no less than 5 µm in order to attain favorable electrical conductivity. Although the upper limit thereof is not particularly limited, it is preferably no more than 200 µm, and more preferably no more than 100 µm because an excessively thick copper plating layer 40 not only causes the effect of improving the electrical conductivity to get saturated but also makes it difficult to form a precise wiring.

The thickness ratio between the adhesion layer 30 and the copper plating layer 40 is preferably no less than 1/50 and no more than 2/30. The copper plating layer 40 is made thicker than that the adhesion layer 30.

(Step (3-iv))

In the step (3-iv), a resist pattern 50 is formed on a part of the copper plating layer 40 to be left as a wiring pattern, by a photolithographic method. The resist is not particularly limited as long as it can protect the predetermined part of the copper plating layer 40 and so on in the following etching step; and any type of resist, whether positive or negative, may be used. For example, the resist pattern 50 is formed by applying a positive type photoresist on the whole surface of the copper plating layer 40, exposing to light a part except for the part to be left as a wiring pattern, and removing the light-exposed part by a developer. The developer is not particularly limited, and an ordinary developer such as TMAH may be used. Although the thickness of the resist pattern 50 is not particularly limited, it is usually no less than 1 µm and no more than 30 µm.

(Step (3-v))

In the step (3-v), a part of the copper plating layer 40 and the adhesion layer 30 where the resist pattern 50 is not formed is removed by etching. A known etching liquid for etching a metal layer (a metal corrosive chemical) may be used, such as aqueous ferric chloride. The etching liquid may be applied by immersing the substrate in the etching liquid or spraying the etching liquid on the substrate.

(Step (3-vi))

In the step (3-vi), the resist pattern 50 is removed. Aqueous alkali metal hydroxide may be used as a remover to remove the resist pattern 50. The substrate may be immersed in the remover, or the remover may be sprayed on the substrate. For example, the resist pattern 50 can be removed by immersing the substrate in 3 mass % of aqueous NaOH with a liquid temperature of 50° C. for about one minute.

(Step (3-vii))

In the step (3-vii), an exposed part of the titanium nitride layer 20 is etched. The titanium nitride layer 20 cannot be etched by the ordinary etching liquid such as aqueous ferric chloride mentioned above. Therefore, the step (3-vii) which employs a different etching liquid is necessary in order to etch the titanium nitride layer 20. For example, a hydrogen peroxide-based etching liquid may be used as the etching liquid for etching the titanium nitride layer 20. To apply the etching liquid, the substrate may be immersed in the etching liquid or the etching liquid may be sprayed on the substrate.

Through the above steps, the metallized substrate 100a is produced. If desired, a plating layer (e.g. Ni/Au plating layer) may be formed on the surface of the metal layer (titanium nitride layer 20, adhesion layer 30, the copper plating layer 40).

<Method for Manufacturing a Metallized Substrate of the Fourth Aspect of the Present Invention>

Figure 4:
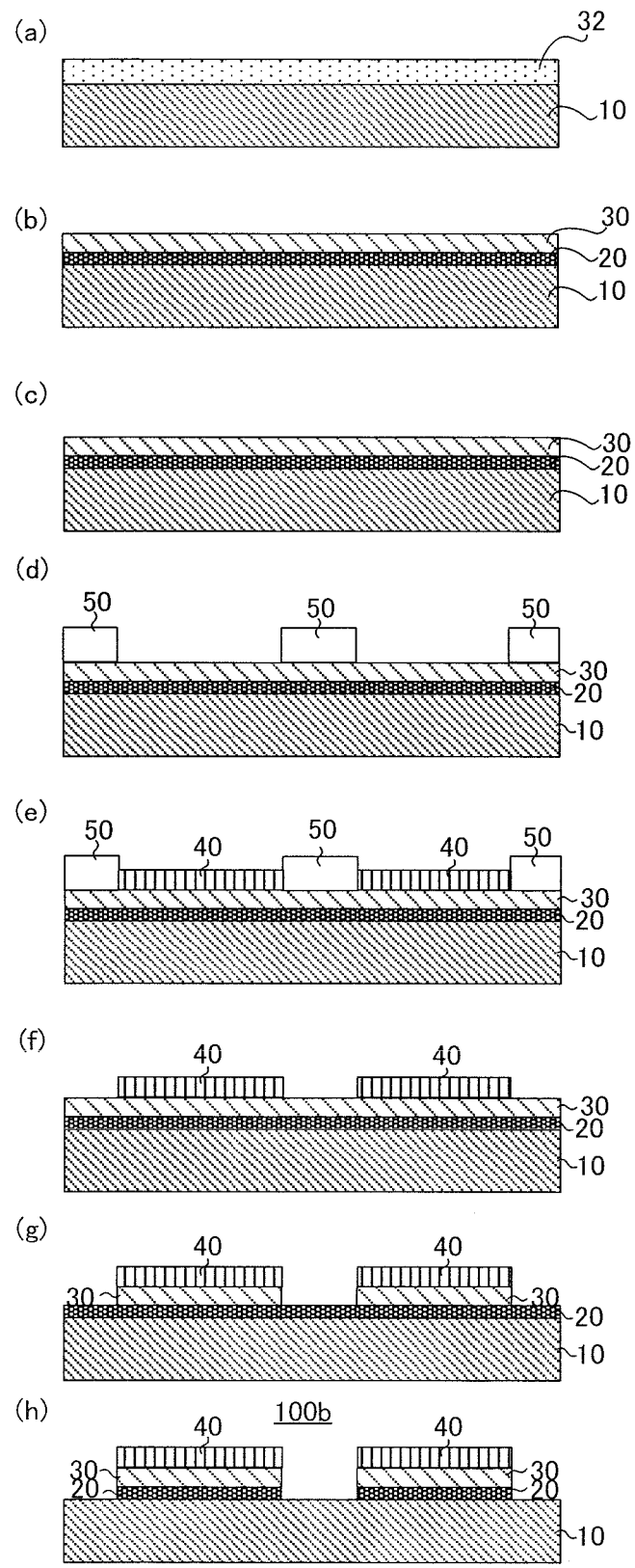
FIG. 4 is a schematic diagram showing each step of the method for manufacturing a metallized substrate of the fourth aspect of the present invention.
Figure 5:
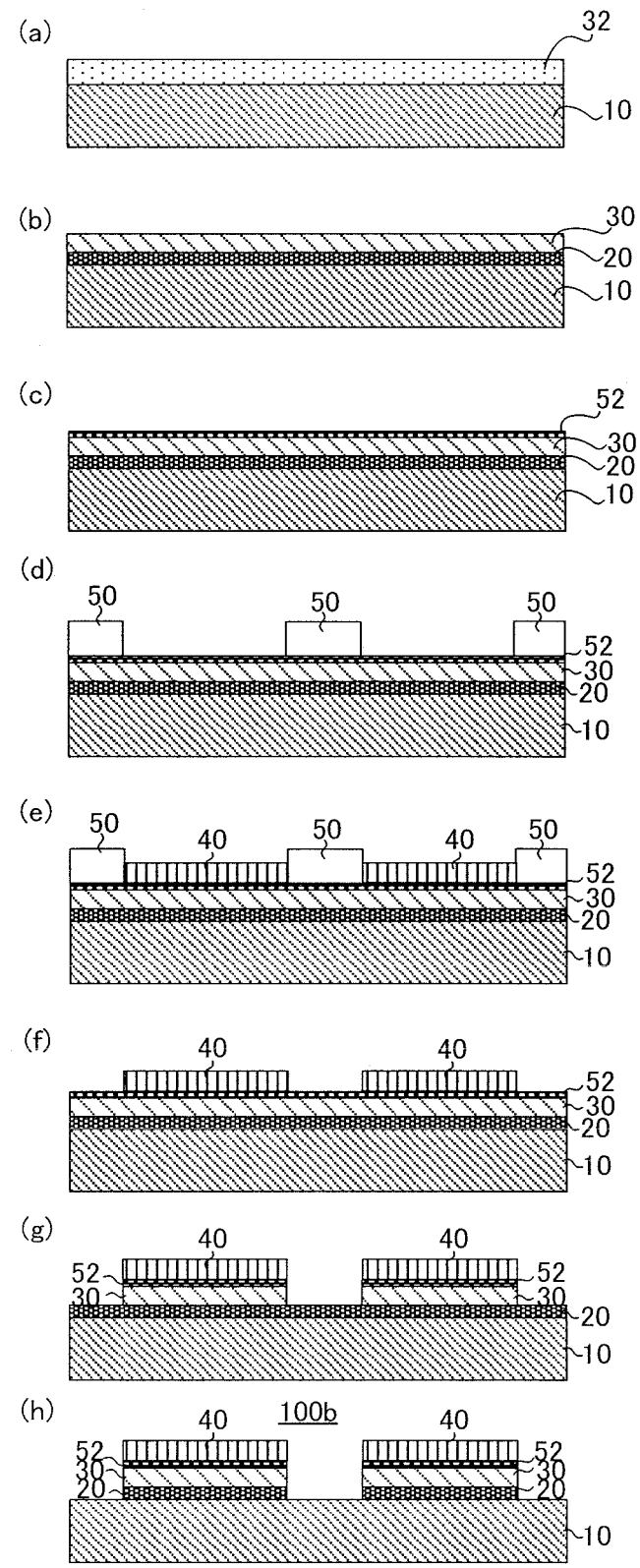
FIG. 5 is a schematic diagram showing each step of the method for manufacturing a metallized substrate of the fourth aspect of the present invention in which an anti-oxidation layer is formed.

Hereinafter, the method for manufacturing a metallized substrate of the fourth aspect of the present invention will be described with reference to FIGS. 4 and 5. FIG. 4 shows the manufacturing steps in the case of not forming an anti-oxidation layer 52. FIG. 5 shows the manufacturing steps in the case of forming an anti-oxidation layer 52.

The method for manufacturing a metallized substrate 100b of the fourth aspect of the present invention includes the following steps of:

(4-i) applying the metal paste composition 32 of the second aspect of the present invention on a whole surface of a side of a nitride ceramic sinter 10 where a metallized pattern is to be formed;

(4-ii) firing a substrate obtained through the step (4-i), thereby forming a titanium nitride layer 20 and an adhesion layer 30 in the order mentioned on or above the nitride ceramic sinter 10;

(4-iii) forming an anti-oxidation layer 52 on the adhesion layer 30, if necessary;

(4-iv) forming a resist pattern 50 on a part of the adhesion layer 30 where a wiring pattern is not to be formed, by a photolithographic method, or forming a resist pattern 50 on a part of the anti-oxidation layer 52 where a wiring pattern is not to be formed, by a photolithographic method, if the step (4-iii) has been carried out;

(4-v) forming a copper plating layer 40 on a part of the adhesion layer 30 or the anti-oxidation layer 52 where the resist pattern is not formed;

(4-vi) removing the resist pattern 50;

(4-v) etching an exposed part of the adhesion layer 30 or an exposed part of the adhesion layer 30 and the anti-oxidation layer 52; and (4-viii) etching an exposed part of the titanium nitride layer 20.

Each of the steps will be described below.

(Step (4-i))

In the step (4-i), the metal paste composition 32 of the second aspect of the present invention is applied on a whole surface of a side of a nitride ceramic sinter 10 where a metallized pattern is to be formed. The step (4-i) is carried out in the same manner as the step (3-i) described above.

(Step (4-ii))

In the step (4-ii), a substrate obtained through the above step is fired, thereby forming a titanium nitride layer 20 and an adhesion layer 30 in the order mentioned on or above the nitride ceramic sinter 10. The step (4-ii) is carried out in the same manner as the step (3-ii) described above. The surface of the adhesion layer 30 may be polished before the subsequent step (4-ii), as described above concerning the step (3-ii).

After the adhesion layer 30 is formed in the step (4-ii), a resist pattern 50 may be directly formed on a part of the adhesion layer where a wiring pattern is not to be formed, by a photolithographic method, as described in the step (4-iv) (see FIG. 4). However, in order to prevent oxidation of the surface of the adhesion layer 30 containing titanium and difficulty in removing it, an anti-oxidation layer 52 may also be formed on the surface of the adhesion layer 30 (see FIG. 5). In the step (4-iii), the anti-oxidation layer 52 is formed on the surface of the adhesion layer 30. In the method of the fourth aspect of the present invention, a resist pattern 50 is formed on a part of the adhesion layer 30 where a wiring pattern is not to be formed, and a copper plating layer 40 is formed on a part of the adhesion layer where the resist pattern 50 is not formed. Therefore, the surface of the adhesion layer 30 where the wiring pattern is to be formed is exposed until the copper plating layer 40 is formed thereon, and the surface may get oxidized. Once an oxide layer is formed on the surface of the adhesion layer 30, it may not be possible to completely remove the oxide layer by an ordinary acid treatment, since the adhesion layer 30 contains a titanium component. In order to surely prevent this, it is preferable to first form the anti-oxidation layer 52 on the adhesion layer 30 in the step (4-iii).

The anti-oxidation layer 52 is not particularly limited as long as it is a metal layer that can prevent oxidation of the surface of the adhesion layer 30 and can be easily etched in the later step (4-vii). Among various metal layers, a copper plating layer (copper strike) for example is preferred in that a thin metal layer with good adhesiveness can be formed within a short time. The copper strike plating may be formed by electroless plating or electroplating. Although the thickness of the anti-oxidation layer 52 is not particularly limited, it may be no less than 0.05 μm and no more than 1 μm for example. By forming the anti-oxidation layer 52 described above, even when the surface is oxidized, it is possible to easily remove the oxide layer by an ordinary acid treatment.

(Step (4-iv))

In the step (4-iv), a resist pattern 50 is formed by a photolithographic method on a part of the adhesion layer 30 formed in the step (4-ii) or on a part of the anti-oxidation layer 52 formed in the step (4-iii) carried out as needed, the part being where a wiring pattern is not to be formed. Although the method of forming the resist pattern is the same as in the step (3-iv) described above, the position of the resist pattern formed in the step (4-iv) is opposite from that in the step (3-iv) because the resist pattern is formed on the part where a wiring pattern is not to be formed. The resist pattern 50 formed in this step (4-iv) needs to be thicker than the copper plating layer 40 to be formed later. The resist pattern 50 may be by 0.2 μm or more thicker than the copper plating layer 40 to be formed, and usually within a range of no less than 2 μm thick and no more than 50 μm thick.

(Step (4-v))

In the step (4-v), the copper plating layer 40 is formed on a part of the adhesion layer 30 where the resist pattern 50 is not formed. If the step (4-iii) has been carried out, the copper plating layer 40 is formed on a part of the anti-oxidation layer 52. The method of forming the copper plating layer 40 may be either electroplating or electroless plating. If the copper strike plating is formed as the anti-oxidation layer 52, it works as the seed for electroplating, and therefore it is efficient and preferable to employ the electroplating. The thickness of the copper plating layer is the same as in the step (3-iii) described above. An additional plating layer (Ni/Au plating) may also be formed on the copper plating layer 40.

(Step (4-vi))

In the step (4-vi), the resist pattern 50 is removed. The method of removing the resist pattern 50 is the same as in the step (3-vi) described above.

(Step (4-vii))

In the step (4-vii), a part of the adhesion layer 30 is etched. If the step (4-iii) has been carried out, a part of the anti-oxidation layer 52 and the adhesion layer 30 is etched.

In the step (4-vii), the copper plating layer 40 is also partially etched, but the etching rate of the adhesion layer 30 is faster than that of the copper plating layer 40 formed by electroplating. Therefore, the adhesion layer 30 can be etched preferentially before the copper plating layer 40 is etched. In the case where the anti-oxidation layer 52 is formed, making its layer thickness sufficiently smaller than that of the copper plating layer 40 enables preferential etching of the part of the adhesion layer 30 that have had the resist pattern on the surface thereof. When the copper plating layer 40 is formed by electroplating and the anti-oxidation layer 52 is formed by electroless plating, the etching rate of the anti-oxidation layer 52 becomes faster than that of the copper plating layer 40, which is thus favorable.

On the other hand, if an additional plating layer (Ni/Au plating) is formed on the copper plating layer 40, it protects the copper plating layer 40 and the adhesion layer 30, or protects the copper plating layer 40, the anti-oxidation layer 52, and the adhesion layer 30, which are present under the additional plating layer. Thus, the layers present under the additional plating layer are not etched from their upper surface side, and the part of the adhesion layer 30 or the anti-oxidation layer 52 that have had the resist pattern can be etched selectively.

Although an etching liquid and an etching method to be employed herein may be the same as in the step (3-v) described above, a sulfuric acid/hydrogen peroxide-based etching liquid is preferred in view of a larger difference between the etching rate of the copper plating layer 40 and the etching rates of the adhesion layer 30 and the anti-oxidation layer 52.

(Step (4-viii))

In the step (4-viii), the titanium nitride layer 20 is etched. An etching liquid and an etching method to be employed are the same as in the step (3-vii) described above.

Through the above steps, the metallized substrate 100b is produced.

<Metallized Substrate 100 (100a, 100b)>

The metallized substrate 100 (100a, 100b) produced by the above methods has a sintered nitride ceramic substrate 10, a titanium nitride layer 20, an adhesion layer 30, and a copper plating layer 40. In some cases, the metallized substrate 100 may also have an additional plating layer (Ni/Au plating) on the copper plating layer 40. When the metallized substrate 100 is manufactured by the manufacturing method of the fourth aspect of the present invention, it preferably has an anti-oxidation layer 52 between the adhesion layer 30 and the copper plating layer 40.

The adhesion layer 30 containing a titanium component is made thin. The copper plating layer 40 having favorable electrical conductivity is formed on the adhesion layer 30 and serves for electrical conduction.

The metal layer ("titanium nitride layer 20/adhesion layer 30/copper plating layer 40" or "titanium nitride layer 20/adhesion layer 30/anti-oxidation layer 52/copper plating layer 40") formed on the sintered nitride ceramic substrate 10 is patterned by a photolithographic method. Adopting the photolithographic method enables formation of a precise wiring compared with the conventional method in which the metal paste is printed to form a wiring pattern, and also enables the line- and space- of the wiring pattern to be preferably no more than 50/50 µm, more preferably no more than 30/30 µm, and still more preferably no more than 20/20 µm.

EXAMPLES

Example 1

Preparation of Metal Paste Composition

A planetary stirring-defoaming apparatus was used to pre-mix: 100 mass parts of a copper powder having an average particle size (D50) of 0.3 µm; 25 mass parts of a titanium hydride powder having an average particle size (D50) of 2 µm; 38 mass parts of isobornyl cyclohexanol as a high-viscosity solvent; 0.6 mass parts of poly(alkyl methacrylate); and 13 mass parts of terpineol. Then, the resultant mixture was subjected to a dispersion treatment with a three-roll mill. Thereby a metal paste composition was prepared. The viscosity at 25° C. of the metal paste composition was 40 Pa·s.

(Production of a Metallized Substrate)

(Step (3-i))

The above metal paste was printed on a whole surface of one side of a sintered aluminum nitride substrate (sintered nitride ceramic substrate 10) (manufactured by Tokuyama Corporation, product name SH-30) by screen printing, and was dried at 150° C. for 10 minutes.

(Step (3-ii))

Subsequently, the substrate having the metal paste thereon was fired under vacuum at 950° C. for 30 minutes, to thereby form an adhesion layer 30. At this time, the layer thickness of the metal paste composition printed was adjusted so as to make the adhesion layer 30 be 3 µm-thick. Then, the surface of the adhesion layer 30 was buffed to be smooth until the adhesion layer 30 became 2 µm-thick. When the cross section of the substrate formed in the same conditions was observed using an electron microscope, the titanium nitride layer 20 was 1 µm-thick. The amount of titanium contained in the adhesion layer 30, which was adjusted to be 2 µm-thick, was 2 mass parts with respect to 100 mass parts of copper in the adhesion layer 30.

(Step (3-iii))

Thereafter, electroplating was performed at a current density of 1.5 A/dm$^2$ using a copper sulfate plating bath, to thereby form a 3 µm-thick copper plating layer 40 on the adhesion layer 30.

(Step (3-iv))

Next, a 10 µm-thick dry film resist was applied on the copper plating layer 40, and was irradiated by an ultrahigh pressure mercury lamp through a photomask having a wiring pattern formed thereon. Then the dry film resist was developed using an aqueous solution of sodium carbonate, and thereby a resist pattern was formed on the copper plating layer 40. The photomask used had a stripe pattern with a pitch of 60 µm (line/space=30/30 µm) for evaluating the pattern lithography performance, a 2 mm-square pattern for evaluating the bonding strength, and a 0.4 mm-wide linear pattern for evaluating the volume resistivity.

(Step (3-v))

Then, spray etching was performed using a ferric chloride solution (Baume degree 45° Be) at a liquid temperature of 20° C. and a spray pressure of 0.15 MPa. Here, the time at which all of the exposed part of the copper plating layer 40 and the adhesion layer 30 not having the dry film resist thereon was etched, was defined as "just-etching time". The etching time was set to be the just-etching time plus five seconds. The substrate after the etching treatment was subjected to ultrasonic cleaning in water, to remove a black residue partially deposited on the substrate after the etching treatment. After the etching treatment, the substrate no longer had the part of the copper plating layer 40 or the adhesion layer 30 that was not covered by the resist, and the titanium nitride layer 20 in a golden color was exposed on the substrate.

(Step (3-vi))

Next, the substrate was immersed in a 3% sodium hydroxide solution, to remove the resist.

(Step (3-vii))

Then, the substrate was immersed in a hydrogen peroxide/ammonia solution to remove a part of the titanium nitride layer 20 exposed on the surface of the substrate by etching. Thereby, a metallized substrate was obtained. The metallized substrate thus obtained was evaluated by the following methods.

<Evaluation Methods>

(Evaluation of Pattern Lithography Performance)

The metallized substrate obtained in the above Example was evaluated in terms of the reproducibility of the stripe-shaped photomask pattern having a pitch of 60 µm (line/space=30/30 µm). The stripe metallized pattern formed on the metallized substrate was observed using a laser microscope, and the line width of the upper portion of the metallized layer was measured. Occurrence of breaking of the line was also checked. The result is shown in Table 1.

(Active Layer: Checking Presence of Titanium Nitride Layer)

The metallized substrate obtained in the above Example was embedded in a resin and was ground to make a sample for observing the cross section of the metallized substrate. The sample thus obtained was observed using a scanning electron microscope (S-3400N manufactured by Hitachi High Technologies Co., Ltd.) (observation magnification of 2000), to see the thickness of the titanium nitride layer (TiN layer) in the interface between the sintered nitride ceramic substrate 10 and the metallized layer. The result is shown in Table 1.

(Amount of Titanium Component in Adhesion Layer)

A central portion of the adhesion layer in the observation sample of the cross section of the metallized substrate obtained above was analyzed using an energy dispersive X-ray analyzer (INCA Energy 350, manufactured by Oxford Instruments Co.) attached to the scanning electron microscope. The electron acceleration voltage in the analysis was 15 kV. The amount of titanium per 100 mass parts of copper was calculated from the mass concentrations of the detected elements. The result is shown in Table 1.

(Evaluation of Bonding Strength)

About 2 µm-thick electroless nickel plating was given on the metallized pattern of the metallized substrate obtained in the above Example, followed by about 0.2 µm-thick electroless gold plating. Thereafter, the bonding strength was evaluated by the following procedure. A 42 alloy nail headpin having a tip diameter of 1.1 mm and having its tip surface nickel-plated was soldered, by a Pb—Sn solder, on a 2 mm-square metallized pattern in a manner perpendicular to the substrate; and the nail headpin was pulled in the direction perpendicular to the substrate at a speed of 10 mm/min. The load exhibited when it broke off the substrate was recorded. The same test was performed five times to calculate an average value of the load. The result is shown in Table 1.

(Evaluation of Volume Resistivity)

The electrical resistivity of 0.4 mm-wide linear metallized pattern formed on the metallized substrate obtained in the above Example was measured by the four-probe method, and an apparent volume resistivity was calculated from the layer thickness of the metallized pattern. The result is shown in Table 1.

Example 2

In the same manner as in Example 1, the metal paste was printed on the aluminum nitride substrate and was dried (step (4-i), carried out in the same manner as in step (3-i)), and the substrate was fired and buffed to thereby form the adhesion layer 30 (step (4-ii), carried out in the same manner as in step (3-ii)).

(Step (4-iv))

Next, a 10 µm-thick dry film resist was applied on a predetermined part of the adhesion layer and was irradiated by an ultrahigh pressure mercury lamp through a photomask having a wiring pattern formed thereon. Then the dry film resist was developed using an aqueous solution of sodium carbonate, to thereby form a resist pattern on the adhesion layer 30. The photomask used had a stripe pattern with a pitch of 60 µm (line/space=30/30 µm) for evaluating the pattern lithography performance, a 2-mm square pattern for evaluating the bonding strength, and a 0.4-mm wide linear pattern for evaluating the volume resistivity.

(Step (4-v))

Next, electroplating was performed at a current density of 3 A/dm$^2$ using a copper sulfate plating bath, to thereby form a 5 µm-thick copper plating layer 40 on a part of the adhesion layer 30 where the resist pattern was not formed. In addition, a 2 µm-thick nickel layer and a 0.2 µm-thick gold layer were formed on the copper plating layer 40 by electroplating.

(Step (4-vi))

Thereafter, the substrate was immersed in a 3% sodium hydroxide solution, to remove the resist.

(Step (4-vii))

Subsequently, the substrate was immersed in a sulfuric acid/hydrogen peroxide-based etching liquid to dissolve and remove a part of the adhesion layer 30 exposed on the surface of the substrate, and thereafter was subjected to ultrasonic cleaning in water to remove a black residue partially deposited on the substrate after the etching treatment. After the etching treatment, the substrate no longer had the part of the adhesion layer 30 that was not covered by the copper plating layer 40, and the titanium nitride layer 20 in a golden color was exposed on the substrate.

(Step (4-viii))

Then, the substrate was immersed in a hydrogen peroxide/ammonia solution to remove a part of the titanium nitride layer 20 exposed on the surface of the substrate by etching. Thereby, a metallized substrate was obtained.

The metallized substrate thus obtained was evaluated in the same manner as in Example 1. It should be noted, though, evaluation of the bonding strength was conducted without forming the electroless nickel plating or the electroless gold plating on the metallized pattern. The result is shown in Table 1.

Example 3

The metal paste was printed on the aluminum nitride substrate and dried (step (4-i)) as in Example 2, and the substrate was fired and buffed to thereby form the adhesion layer 30 (step (4-ii)) as in Example 1.

(Step (4-iii))

Subsequently, an electroless copper plating bath using formalin as a reducing agent was used to form an 0.5 µm-thick anti-oxidation layer 52 made of an electroless plating layer.

(Step (4-iv))

Next, a 10 µm-thick dry film resist was applied on a predetermined part of the anti-oxidation layer 52 and was exposed to an ultrahigh pressure mercury lamp through a photomask having a wiring pattern formed thereon. Then the dry film resist was developed using an aqueous solution of sodium carbonate, to thereby form a resist pattern on the anti-oxidation layer 52. The photomask used had a stripe pattern with a pitch of 60 µm (line/space=30/30 µm) for evaluating the pattern lithography performance, a 2-mm square pattern for evaluating the bonding strength, and a 0.4-mm wide linear pattern for evaluating the volume resistivity.

(Step (4-v))

Next, electroplating was performed at a current density of 3 A/dm² using a copper sulfate plating bath to thereby form a 5 μm-thick copper plating layer 40 on a part of the anti-oxidation layer 52 where the resist pattern was not formed. In addition, a 2 μm-thick nickel layer and a 0.2 μm-thick gold layer were formed on the copper plating layer 40 by electroplating.

(Step (4-vi))

Thereafter, the substrate was immersed in a 3% sodium hydroxide solution to remove the resist.

(Step (4-vii))

Next, the substrate was immersed in a sulfuric acid/hydrogen peroxide-based etching liquid to dissolve and remove apart of the anti-oxidation layer 52 exposed on the surface of the substrate and a part of the adhesion layer 30 thereunder. After that, the substrate was subjected to ultrasonic cleaning in water to remove a black residue partially deposited on the substrate after the etching treatment. After the etching treatment, the substrate no longer had the part of the anti-oxidation layer 52 or the adhesion layer 30 that was not covered by the copper plating layer 40, and the titanium nitride layer 20 in a golden color was exposed on the substrate.

(Step (4-viii))

Subsequently, the substrate was immersed in a hydrogen peroxide/ammonia solution to remove a part of the titanium nitride layer 20 exposed on the surface of the substrate by etching. Thereby, a metallized substrate was obtained. The metallized substrate thus obtained was evaluated in the same manner as in Example 1. It should be noted, though, evaluation of the bonding strength was conducted without forming the electroless nickel plating or the electroless gold plating on the metallized pattern. The result is shown in Table 1.

Example 4

A metallized substrate was made in the same manner as in Example 1 except that the surface of the adhesion layer 30 was buffed until the adhesion layer 30 became 1 μm-thick in the step (3-ii). The metallized substrate was evaluated in the same manner as in Example 1. The result is shown in Table 1.

Example 5

A metallized substrate was made in the same manner as in Example 1 except that: the layer thickness of the metal paste composition printed was adjusted so as to make the adhesion layer 30 become 5 μm-thick in the step (3-i); and the surface of the adhesion layer 30 was buffed to be smooth until the adhesion layer 30 became 4 μm-thick. When the cross section of the metallized substrate formed in the same conditions was observed using an electron microscope, the titanium nitride layer 20 was 1.5 μm-thick. The amount of titanium contained in the 4 μm-thick adhesion layer 30 was 3 mass parts with respect to 100 mass parts of copper in the adhesion layer 30. The metallized substrate obtained was evaluated in the same manner as in Example 1. The result is shown in Table 1.

Comparative Example 1

Preparation of Metal Paste Composition

A planetary stirring-defoaming apparatus was used to pre-mix: 100 mass parts of a copper powder having an average particle size (D50) of 0.3 μm; 24 mass parts of isobornyl cyclohexanol as a high-viscosity solvent; 0.4 mass parts of poly(alkylmethacrylate); and 8.5 mass parts of terpineol. Then, a three-roll mill was used to disperse the resultant mixture. Thereby, a metal paste composition was prepared.

(Production of Metallized Substrate)

The same procedure as in Example 1 was performed except for using the metal paste composition prepared above as a metal paste composition. However, since the metallized layer peeled off in the interface between the aluminum nitride substrate 10 and the adhesion layer 30 when the copper plating layer 40 was etched (step (3-v)), a metalized substrate could not be produced. A titanium nitride layer 20 was not formed in the interface between the aluminum nitride substrate 10 and the adhesion layer 30.

Comparative Example 2

A metallized substrate was made in the same manner as in Example 1 except that: the layer thickness of the metal paste composition printed was adjusted so as to make the adhesion layer 30 become 8 μm-thick in the step (3-i); and the surface of the adhesion layer 30 was buffed to be smooth until the adhesion layer 30 became 7 μm-thick in the step (3-ii). When the cross section of the metallized substrate formed in the same conditions was observed using an electron microscope, the titanium nitride layer 20 was 2.5 μm-thick. The amount of titanium contained in the 7 μm-thick adhesion layer 30 was 6 mass parts with respect to 100 mass parts of copper in the adhesion layer 30. The metallized substrate was evaluated in the same manner as in Example 1. The result is shown in Table 1.

TABLE 1

|  | Pattern Lithography Performance | | Layer | | | | |
|---|---|---|---|---|---|---|---|
|  | Line Width (μm) of Upper Portion of Metallized Layer | Breaking of Line | Thickness (μm) of Titanium Nitride Layer | Layer Thickness (μm) of Adhesion Layer | Amount of Titanium per 100 Mass Parts of Copper in the Adhesion Layer | Bonding Strength (kgf) | Volume Resistivity ($10^{-8}$ Ω · m) |
| Example 1 | 20 | No | 1 | 2 | 2 | 11 | 2.9 |
| Example 2 | 29 | No | 1 | 2 | 2 | 11 | 3.4 |
| Example 3 | 29 | No | 1 | 2 | 2 | 11 | 3.3 |
| Example 4 | 22 | No | 1 | 1 | 2 | 11 | 2.7 |
| Example 5 | 14 | No | 1.5 | 4 | 3 | 11 | 3.9 |
| Comparative Example 2 | 5 | Yes | 2.5 | 7 | 6 | 11 | 5.5 |

In Examples 1, 4, and 5, there was no breaking of the line in the metallized pattern of the metallized substrate obtained, since the thickness of the adhesion layer 30 was no more than 5 μm and therefore the progress of side etching was small when the etching was performed in the step (3-v). In the manufacturing method of Comparative Example 2, breaking of the line occurred in places, since the thickness of the adhesion layer 30 was large and the progress of side etching was significant when the etching was performed in the step (3-v) and therefore the line width (size in mask: 30 μm) of the metallized pattern of the metallized substrate obtained became smaller.

The present invention has been described above as to the embodiment which is supposed to be practical as well as preferable at present. However, it should be understood that the present invention is not limited to the embodiment disclosed in the specification of the present application and can be appropriately modified within the range that does not depart from the gist or spirit of the invention, which can be read from the appended claims and the overall specification, and that a metallized substrate, a metal paste composition, and a method for manufacturing the metallized substrate with such modifications are also encompassed within the technical range of the present invention.

INDUSTRIAL APPLICABILITY

The metallized substrate of the present invention can be used for mounting an electronic device such as an LED. Particularly, when the sintered substrate is made of AlN, it can be favorably used as a substrate for mounting an electronic device which releases a large amount of heat, such as a high power LED.

DESCRIPTION OF THE REFERENCE NUMERALS 10 sintered nitride ceramic substrate
20 titanium nitride layer
30 adhesion layer
40 copper plating layer
50 resist pattern
52 anti-oxidation layer
100, 100a, 100b metallized substrate

The invention claimed is:
1. A method for manufacturing a metallized substrate comprising the steps of:
(i) applying a metal paste composition on a whole surface of a side of a nitride ceramic sinter where a metallized pattern is to be formed, wherein the metal paste composition comprises: a metal component containing a copper powder and a titanium hydride powder, and not containing a silver powder; and a high-viscosity solvent having a viscosity at 25° C. of no less than 100 Pa-s, and wherein the metal paste composition contains 5 to 50 mass parts of said titanium hydride powder and 10 to 50 mass parts of said high-viscosity solvent per 100 mass parts of said copper powder,
(ii) firing a substrate obtained through the step (i), thereby forming a titanium nitride layer and an adhesion layer in the order mentioned on or above the nitride ceramic sinter;
(iii) forming a copper plating layer on the adhesion layer;
(iv) forming a resist pattern on a part of the copper plating layer to be left as a wiring pattern, by a photolithographic method;
(v) removing a part of the copper plating layer and the adhesion layer where the resist pattern is not formed, by an etching process;
(vi) removing the resist pattern; and
(vii) etching an exposed part of the titanium nitride layer.
2. A method for manufacturing a metallized substrate comprising the steps of:
(i) applying a metal paste composition on a whole surface of a side of a nitride ceramic sinter where a metallized pattern is to be formed, wherein the metal paste composition comprises: a metal component containing a copper powder and a titanium hydride powder, and not containing a silver powder; and a high-viscosity solvent having a viscosity at 25° C. of no less than 100 Pa-s, and wherein the metal paste composition contains 5 to 50 mass parts of said titanium hydride powder and 10 to 50 mass parts of said high-viscosity solvent per 100 mass parts of said copper powder,
(ii) firing a substrate obtained through the step (i), thereby forming a titanium nitride layer and an adhesion layer in the order mentioned on or above the nitride ceramic sinter;
(iii) forming a resist pattern on a part of the adhesion layer where a wiring pattern is not to be formed, by a photolithographic method;
(iv) forming a copper plating layer on a part of the adhesion layer where the resist pattern is not formed;
(v) removing the resist pattern;
(vi) etching an exposed part of the adhesion layer; and
(vii) etching an exposed part of the titanium nitride layer.
3. The method for manufacturing the metallized substrate according to claim 2, further comprising the step of:
(ii') forming an anti-oxidation layer on the adhesive layer by copper strike, after the step (ii).
4. The method for manufacturing the metallized substrate according to claim 1, further comprising the step of:
(ii") polishing a surface of the adhesion layer, after the step (ii).
5. The method for manufacturing the metallized substrate according to claim 1,
wherein the metal paste composition comprises no binder component or less than 4 mass parts of a binder component per 100 mass parts of the copper powder.
6. The method for manufacturing the metallized substrate according to claim 1,
wherein the titanium hydride powder in the metal paste composition does not contain a coarse particle having a particle size greater than 5 μm.
7. The method for manufacturing the metallized substrate according to claim 1,
wherein an average particle size of the copper powder in the metal paste composition is no less than 0.1 μm and less than 1.0 μm.
8. The method for manufacturing the metallized substrate according to claim 2, further comprising the step of:
(ii") polishing a surface of the adhesion layer, after the step (ii).
9. The method for manufacturing the metallized substrate according to claim 2,
wherein the metal paste composition comprises no binder component or less than 4 mass parts of a binder component per 100 mass parts of the copper powder.
10. The method for manufacturing the metallized substrate according to claim 2,
wherein the titanium hydride powder in the metal paste composition does not contain a coarse particle having a particle size greater than 5 μm.

11. The method for manufacturing the metallized substrate according to claim 2,
wherein an average particle size of the copper powder in the metal paste composition is no less than 0.1 μm and less than 1.0 μm.

\* \* \* \* \*